(12) United States Patent
Carpio et al.

(10) Patent No.: US 8,615,051 B2
(45) Date of Patent: *Dec. 24, 2013

(54) SYSTEM AND METHOD FOR EFFECTIVELY TRANSFERRING ELECTRONIC INFORMATION

(75) Inventors: Fredrik Carpio, San Diego, CA (US); Milton Frazier, San Marcos, CA (US); Nikolaos Georgis, San Diego, CA (US)

(73) Assignees: Sony Corporation, Tokyo (JP); Sony Electronics Inc., Park Ridge, NJ (US)

( * ) Notice: Subject to any disclaimer, the term of this patent is extended or adjusted under 35 U.S.C. 154(b) by 0 days.

This patent is subject to a terminal disclaimer.

(21) Appl. No.: 13/358,592

(22) Filed: Jan. 26, 2012

(65) Prior Publication Data

US 2012/0121007 A1    May 17, 2012

Related U.S. Application Data

(63) Continuation of application No. 12/157,295, filed on Jun. 9, 2008, now Pat. No. 8,139,655.

(51) Int. Cl.
*H04L 5/12*      (2006.01)
*H04L 27/00*     (2006.01)
*H04L 27/06*     (2006.01)

(52) U.S. Cl.
USPC ............................ 375/262; 375/295; 375/341

(58) Field of Classification Search
USPC ................. 375/219, 261, 295, 316, 341, 340; 708/530, 531; 714/746, 752, 758, 800
See application file for complete search history.

(56) References Cited

U.S. PATENT DOCUMENTS

| 5,870,412 A | 2/1999 | Schuster et al. |
| 6,694,478 B1 | 2/2004 | Martinian et al. |
| 8,122,324 B2 | 2/2012 | Matsumoto et al. |
| 2003/0021240 A1 * | 1/2003 | Moon et al. ................... 370/320 |

FOREIGN PATENT DOCUMENTS

| JP | 09-161414 | 6/1997 |
| JP | 10-084334 | 3/1998 |
| WO | WO 2006/078836 A1 | 7/2006 |

* cited by examiner

*Primary Examiner* — Tesfaldet Bocure
(74) *Attorney, Agent, or Firm* — Gregory J. Koerner; Redwood Patent Law (57) ABSTRACT

A system for handling transmitted electronic information includes a transmitter with an encoder that performs a parity encoding procedure. The encoder creates parity blocks for embedding in transmission packets. The parity blocks may be based upon data segments from one or more of the transmission packets. The system also includes a receiver with a decoder that utilizes the parity blocks for performing a packet validation procedure to identify corrupted packets from among the transmission packets. The decoder also performs a packet reconstruction procedure with selected ones of the data segments and the parity blocks to produce reconstructed data segments for the corrupted packets.

18 Claims, 11 Drawing Sheets

SYSTEM AND METHOD FOR EFFECTIVELY TRANSFERRING ELECTRONIC INFORMATION

CROSS-REFERENCE TO RELATED APPLICATIONS

This application is a Continuation of U.S. Non-Provisional patent application Ser. No. 12/157,295, entitled "System And Method For Effectively Transferring Electronic Information," filed on Jun. 9, 2008 now U.S. Pat. No. 8,139,655. This related application is commonly assigned, and is hereby incorporated by reference.

BACKGROUND SECTION

1. Field of the Invention

This invention relates generally to techniques for handling electronic information, and relates more particularly to a system and method for effectively transferring electronic information.

2. Description of the Background Art

Implementing effective methods for transferring electronic information is a significant consideration for designers and manufacturers of contemporary electronic devices. However, effectively transferring electronic information may create substantial challenges for system designers. For example, enhanced demands for improved transfer techniques may require more system processing power and require additional software capabilities. An increase in processing or software requirements may also result in a corresponding detrimental economic impact due to increased production costs and operational inefficiencies.

Furthermore, enhanced device capability to perform various advanced transfer operations may provide additional benefits to a system user, but may also place increased demands on the control and management of various system components. For example, an enhanced electronic device that requires robust transfers of various types of electronic content may benefit from an effective implementation because of the large amount and complexity of the digital data involved.

Due to growing demands on system resources and substantially increasing data magnitudes, it is apparent that developing new techniques for transferring electronic information is a matter of concern for related electronic technologies. Therefore, for all the foregoing reasons, developing effective techniques for transferring electronic information remains a significant consideration for designers, manufacturers, and users of contemporary electronic devices.

SUMMARY

In accordance with the present invention, a system and method for effectively transferring electronic information are disclosed. In one embodiment, an encoder of a transmitter initially accesses an input packet from any appropriate source device. The encoder analyzes the data from the input packet. The encoder then generates a parity block for the input packet by utilizing any appropriate techniques. For example, in certain embodiments, the encoder generates the parity block based upon binary data values of the input packet in combination with the binary data values of one or more neighboring packets.

Next, the encoder embeds the parity block in the input packet. The transmitter may then transmit the encoded packet to a receiver by utilizing any appropriate means. The encoder determines whether any more packets remain to be encoded. If additional packets remain, then the transmit process returns to encode and transmit the remaining packets in a similar manner. If no additional packets remain, then the transmit process may terminate.

In certain embodiments, a receiver may receive a transmitted packet by utilizing any appropriate techniques. The receiver stores the received packet in a receiver buffer. A decoder of the receiver performs a packet validation procedure upon the received packet by utilizing any effective techniques. For example, in certain embodiments, the decoder may validate the packet by utilizing an embedded parity block.

If the current packet is valid (uncorrupted), then the receiver may output the validated packet to any appropriate destination device. However, if the current packet is not valid (corrupted), then the decoder may perform a packet reconstruction procedure by utilizing any appropriate techniques. For example, in certain embodiments, the decoder may reconstruct a damaged or missing packet by utilizing data and parity block information from one or more neighboring packets.

Once the corrupted packet is reconstructed, then the receiver may output the reconstructed packet to any appropriate destination device. The decoder determines whether additional packets remain to be validated and potentially reconstructed. If more packets remain, then the transfer process returns to validate, reconstruct, and output any additional packets. However, if no additional packets remain, then the transfer process may terminate. For at least the foregoing reasons, the present invention therefore provides an improved system and method for effectively transferring electronic information.

DETAILED DESCRIPTION

The present invention relates to an improvement in techniques for transferring electronic information. The following description is presented to enable one of ordinary skill in the art to make and use the invention, and is provided in the context of a patent application and its requirements. Various modifications to the disclosed embodiments will be apparent to those skilled in the art, and the generic principles herein may be applied to other embodiments. Therefore, the present invention is not intended to be limited to the embodiments shown, but is to be accorded the widest scope consistent with the principles and features described herein.

The present invention comprises a system and method for effectively transferring electronic information, and includes a transmitter with an encoder that performs a parity encoding procedure. The encoder creates parity blocks for embedding in transmission packets. The parity blocks may be based upon data segments from one or more of the transmission packets. The system also includes a receiver with a decoder that utilizes the parity blocks for performing a packet validation procedure to identify corrupted packets from among the transmission packets. The decoder advantageously performs a packet reconstruction procedure with selected ones of the data segments and the parity blocks to thereby produce reconstructed data segments for the corrupted packets.

Figure 1:
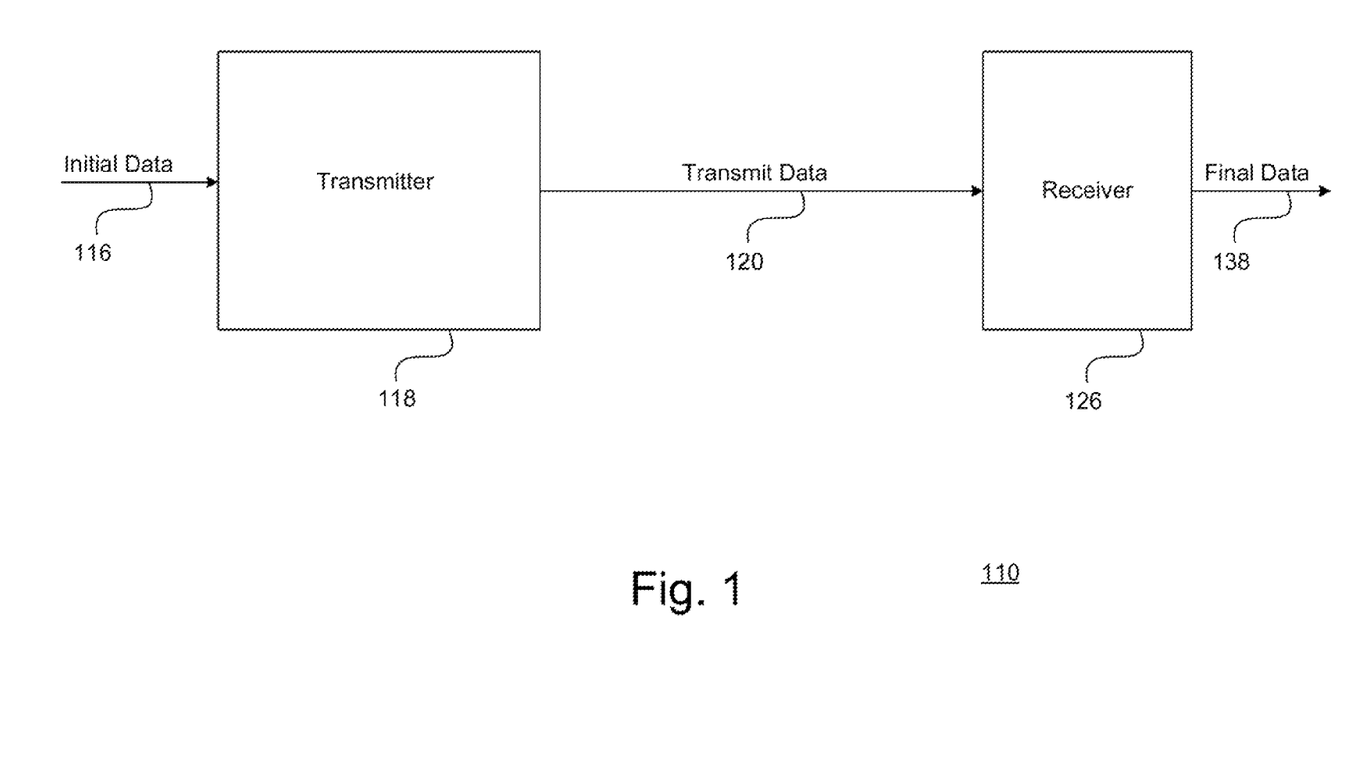
FIG. 1 is a block diagram of a data transmission system, in accordance with one embodiment of the present invention.

Referring now to FIG. 1, a block diagram of a data transmission system 110 is shown, in accordance with one embodiment of the present invention. In the FIG. 1 embodiment, data transmission system 110 includes, but is not limited to, a transmitter 118 and a receiver 126. In alternate embodiments, data transmission system 110 may be implemented using components and configurations in addition to, or instead of, certain of those components and configurations discussed in conjunction with the FIG. 1 embodiment.

In the FIG. 1 embodiment of data transmission system 110, a transmitter 118 receives initial data 116 from any appropriate data source. For example, initial data may be provided as packets of digital information from a source memory device. In certain embodiments, data transmission system 110 may be implemented as a uni-directional wireless or hard-wired television broadcasting system. Transmitter 118 modulates the initial data 116 and then outputs the modulated initial data 116 over any appropriate type of transmission channel as transmit data 120. A receiver 126 of data transmission system 110 may then receive, demodulate, and process the transmit data 120 to thereby provide final data 138 to any appropriate data destination, such as a destination memory device.

In certain environments, transmit data 120 may become corrupted during the foregoing transmission process. However, with certain types of transmit data 120, no loss of digital information is acceptable. For example, if transmit data 120 is a binary file, such as software instructions, any corrupted digital information may render transmit data 120 unusable. This problem becomes more significant when the transmission path between transmitter 118 and receiver 126 is uni-directional, since receiver 126 would then be unable to notify transmitter 118 about any errors, and could also not request a retransmission of the corrupted transmit data 120.

In accordance with the present invention, transmitter 118 therefore encodes appropriate parity information into transmit data 120. Receiver 126 may thus utilize the encoded parity information to verify transmit data 120. In addition, receiver 126 may also perform a reconstruction procedure using the encoded parity information to advantageously reconstruct any corrupted elements of transmit data 120. Further details regarding the implementation and utilization of transmitter 118 and receiver 126 are further discussed below in conjunction with FIGS. 2-9.

Figure 2:
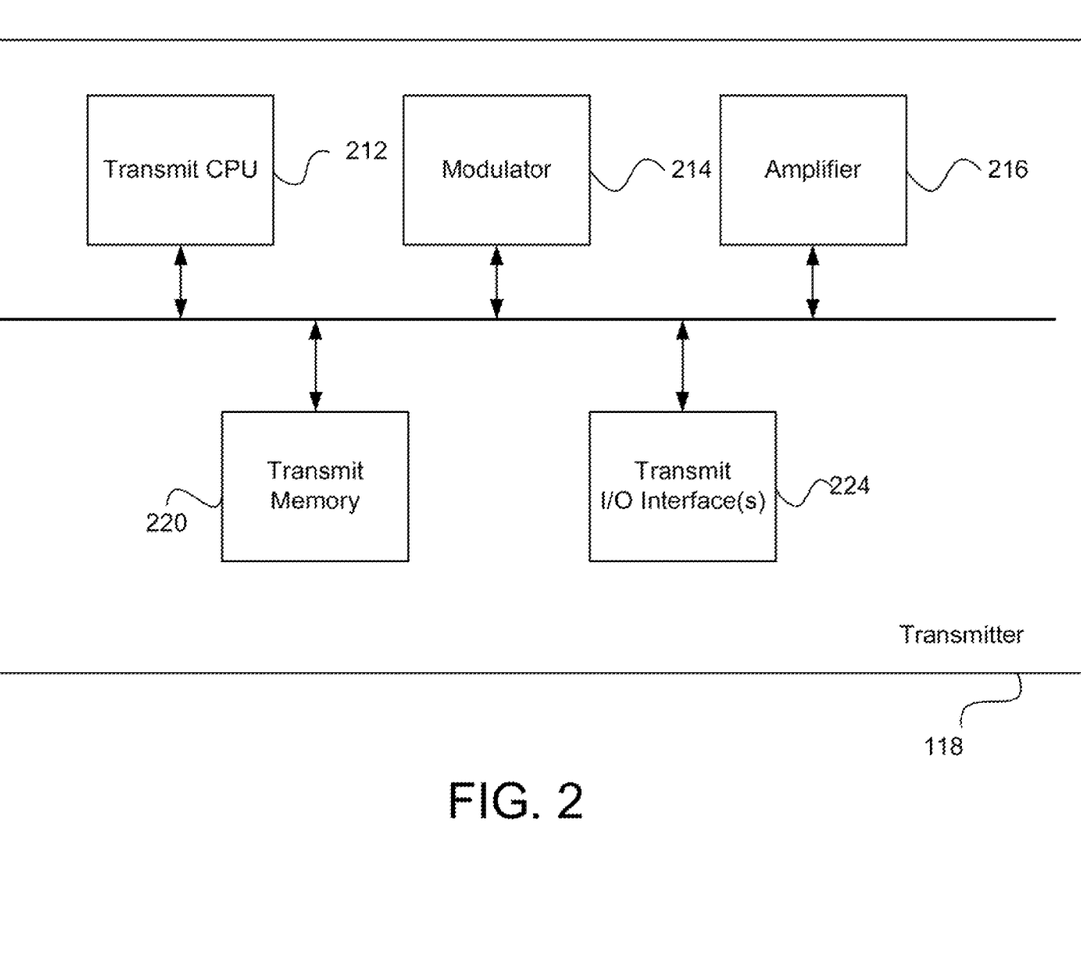
FIG. 2 is a block diagram for one embodiment of the transmitter of FIG. 1, in accordance with the present invention.

Referring now to FIG. 2, a block diagram of the FIG. 1 transmitter 118 is shown, in accordance with the present invention. In the FIG. 2 embodiment, transmitter 118 includes, but is not limited to, a transmit central processing unit (transmit CPU) 212, a modulator 214, an amplifier 216, a transmit memory 220, and one or more transmit input/output interface(s) (transmit I/O interface(s)) 224. In alternate embodiments, transmitter 118 may alternately be implemented using components and configurations in addition to, or instead of, certain of those components and configurations discussed in conjunction with the FIG. 2 embodiment.

In the FIG. 2 embodiment, transmit CPU 212 may be implemented to include any appropriate and compatible microprocessor device that preferably executes software instructions to thereby control and manage the operation of transmitter 118. In the FIG. 2 embodiment, transmit memory 220 may be implemented to include any combination of desired storage devices, including, but not limited to, read-only memory (ROM), random-access memory (RAM), and various types of non-volatile memory, such as floppy disks, memory sticks, compact disks, or hard disks. The contents and functionality of transmit memory 220 are further discussed below in conjunction with FIG. 3.

In the FIG. 2 embodiment, transmit I/O interface(s) 224 may include one or more input and/or output interfaces to receive and/or transmit any required types of information by transmitter 118. In the FIG. 2 embodiment, a modulator 214 may modulate initial data 116 (FIG. 1) to produce modulated data that amplifier 216 amplifies to produce transmit data 120 (FIG. 1) that is provided through a transmit I/O interface 224 to receiver 126 (FIG. 1) by any effective means. For example, in certain embodiments, the amplified transmit data 120 may be wirelessly broadcast from a transmit antenna coupled to an appropriate transmit I/O interface 224. The implementation and utilization of transmitter 118 is further discussed below in conjunction with FIGS. 3, 7, and 8.

Figure 3:
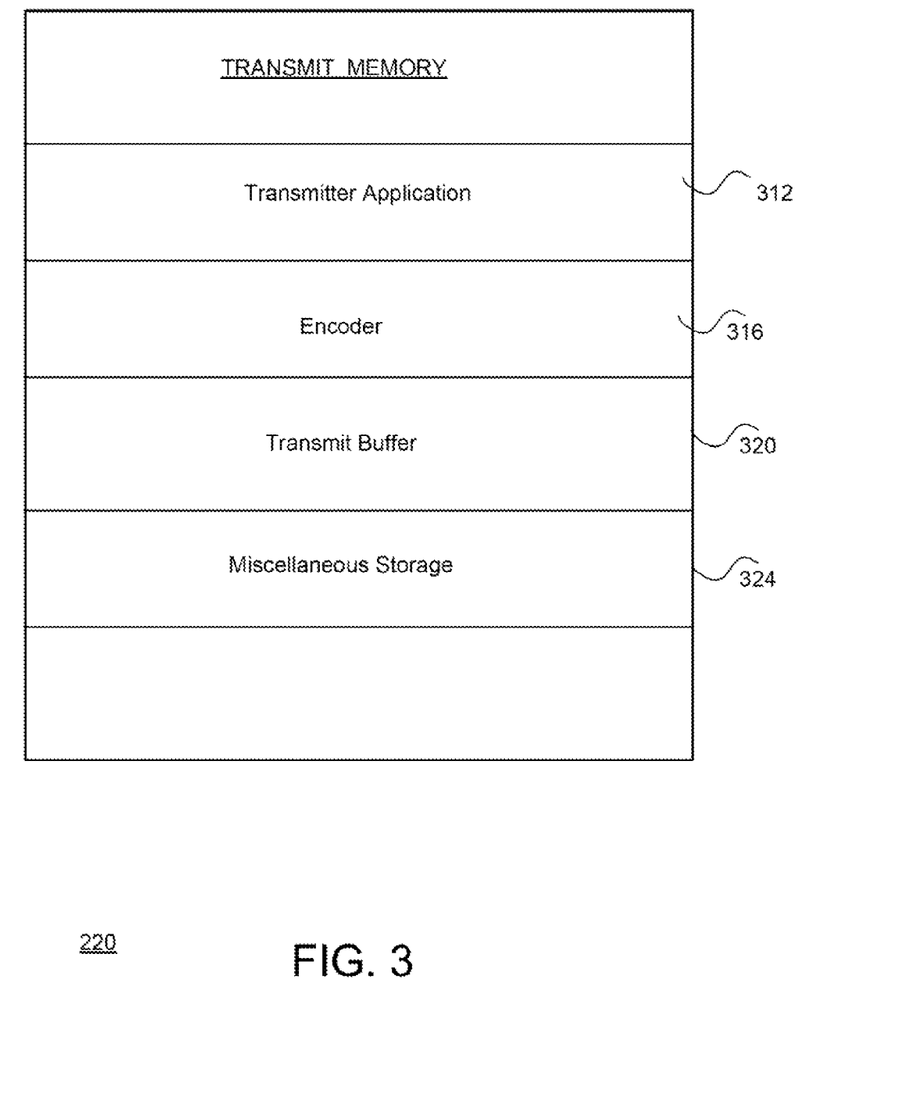
FIG. 3 is a block diagram for one embodiment of the transmit memory of FIG. 2, in accordance with the present invention.

Referring now to FIG. 3, a block diagram for one embodiment of the FIG. 2 transmit memory 220 is shown, in accordance with the present invention. In the FIG. 3 embodiment, transmit memory 220 may include, but is not limited to, a transmitter application 312, an encoder 316, a transmit buffer 320, and miscellaneous storage 324. In alternate embodiments, transmit memory 220 may include various other components and functionalities in addition to, or instead of, certain those components and functionalities discussed in conjunction with the FIG. 3 embodiment.

In the FIG. 3 embodiment, transmitter application 312 may include program instructions that are preferably executed by transmit CPU 212 (FIG. 2) to perform various functions and operations for transmitter 118. The particular nature and functionality of transmitter application 312 typically varies depending upon factors such as the specific type and particular functionality of the corresponding transmitter 118. In the FIG. 3 embodiment, transmitter 118 may utilize an encoder 316 to perform a parity encoding procedure to create a parity block of parity information by utilizing any effective techniques.

For example, in certain embodiments, encoder 316 encodes a parity block for a given packet by utilizing digital information from one or more surrounding packets to thereby permit verification and reconstruction if the given packet is corrupted during transmission. One specific technique for encoding parity information is discussed below in conjunction with FIGS. 7 and 8. In the FIG. 3 embodiment, encoder 316 may utilize transmit buffer 320 to temporarily store packets during the parity encoding procedure. In the FIG. 3 embodiment, transmitter 118 may utilize miscellaneous storage 324 for storing any required types of additional information.

In the FIG. 3 embodiment, encoder 316 is shown a being implemented as software program instructions. However, in certain embodiments, encoder 316 may be alternately implemented as hardware components that perform equivalent functions. Additional details regarding the operation and implementation of encoder 316 are further discussed below in conjunction with FIGS. 7 and 8.

Figure 4:
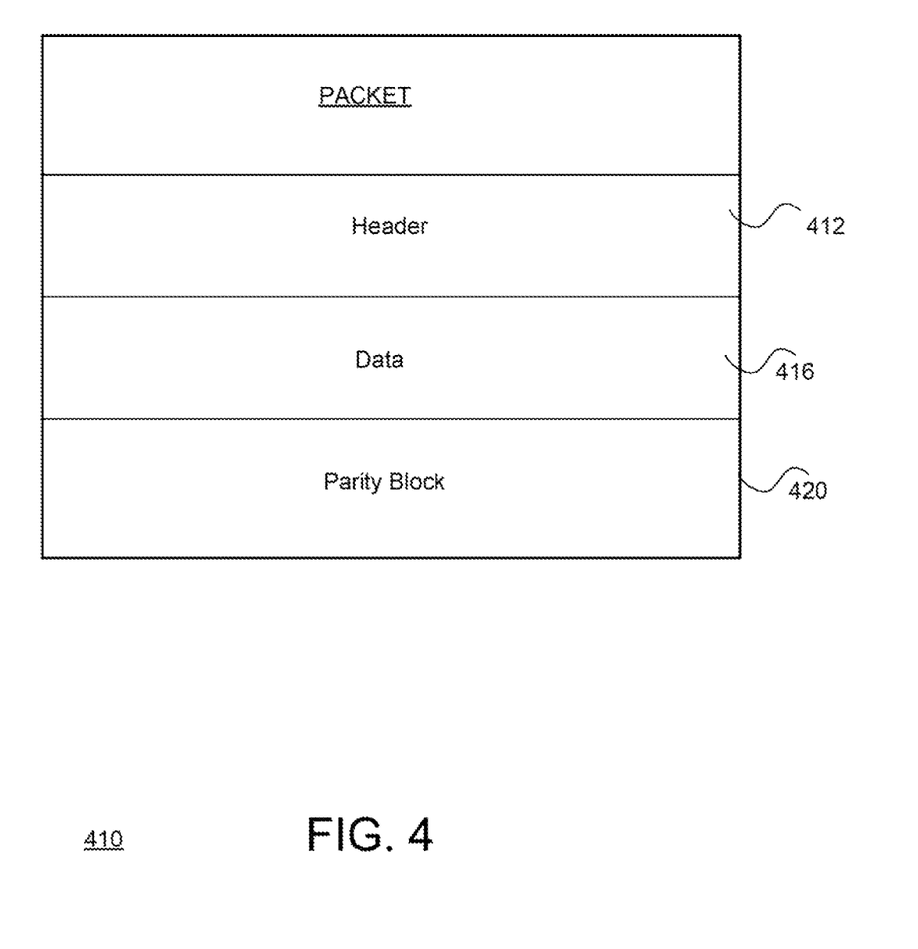
FIG. 4 is a block diagram for one exemplary embodiment of a packet, in accordance with the present invention.

Referring now to FIG. 4, a diagram for one embodiment of a packet 410 is shown, in accordance with the present invention. In the FIG. 4 embodiment, packet 410 may include, but is not limited to, a header 412, data 416, and a parity block 420. In alternate embodiments, packet 410 may include other elements and configurations in addition to, or instead of, certain of those elements and configurations discussed in conjunction with the FIG. 4 embodiment.

In the FIG. 4 embodiment, packet 410 includes a header 412 that may include any relevant types of information. For example, header 412 may describe the specific contents and sizes of the remaining elements of packet 410. In the FIG. 4 embodiment, data 416 may include any appropriate type of information for transmission to receiver 126 (FIG. 1). For example, data 416 may include video information, audio information, software instructions, digital files, text, graphics, and any other types of electronic content. In the FIG. 4 embodiment, parity block 420 may include any appropriate type of information for allowing receiver 126 to effectively verify and potentially reconstruct any corrupted or damaged packets 410. The creation and utilization of parity block 420 are further discussed below in conjunction with FIGS. 7-9.

Figure 5:
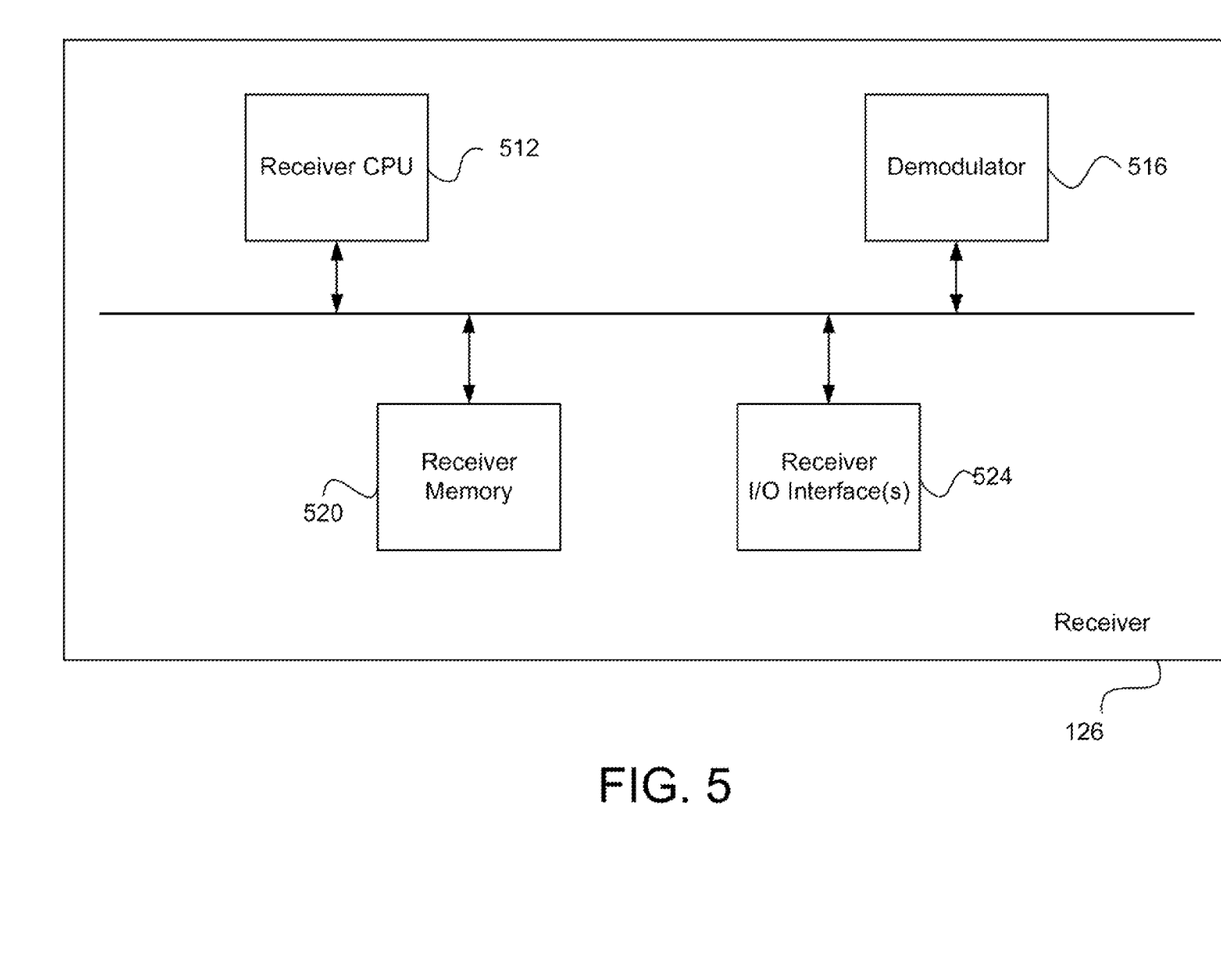
FIG. 5 is a block diagram for one embodiment of a receiver, in accordance with the present invention.

Referring now to FIG. 5, a block diagram for one embodiment of the FIG. 1 receiver 126 is shown, in accordance with the present invention. In the FIG. 5 embodiment, receiver 126 may include, but is not limited to, a receiver central processing unit (receiver CPU) 512, a demodulator 516, a receiver memory 520, and one or more receiver input/output interface(s) (receiver I/O interface(s)) 524.

In alternate embodiments, receiver 126 may readily be implemented using various components and configurations in addition to, or instead of, certain of those components and configurations discussed in conjunction with the FIG. 5 embodiment. Furthermore, in the FIG. 5 embodiment, receiver 126 may be implemented as a part of any appropriate type of electronic device. For example, in certain embodiments, receiver 126 may be implemented in a stationary or portable consumer-electronics device, such as a television, a personal computer, a settop box, an audio-visual entertainment device, a cellular telephone, or a personal digital assistant (PDA).

In the FIG. 5 embodiment, receiver CPU 512 may be implemented to include any appropriate and compatible microprocessor device that preferably executes software instructions to thereby control and manage the operation of receiver 126. In the FIG. 5 embodiment, receiver memory 520 may be implemented to include any combination of desired storage devices, including, but not limited to, read-only memory (ROM), random-access memory (RAM), and various types of non-volatile memory, such as floppy disks, memory sticks, compact disks, or hard disks. The contents and functionality of receiver memory 520 are further discussed below in conjunction with FIG. 6.

In the FIG. 5 embodiment, receiver I/O interface(s) 524 may include one or more input and/or output interfaces to receive and/or transmit any required types of information by receiver 126. In the FIG. 5 embodiment, a demodulator 516 may demodulate transmit data 120 to produce final data 138 (FIG. 1) that may then be provided through a receiver I/O interface 224 to an appropriate data destination by any effective means. In accordance with the present invention, receiver 126 may verify and potentially reconstruct any corrupted packets 410 in transmit data 120. Packet verification and reconstruction procedures by receiver 126 are further discussed below in conjunction with FIGS. 7 and 9.

Figure 6:
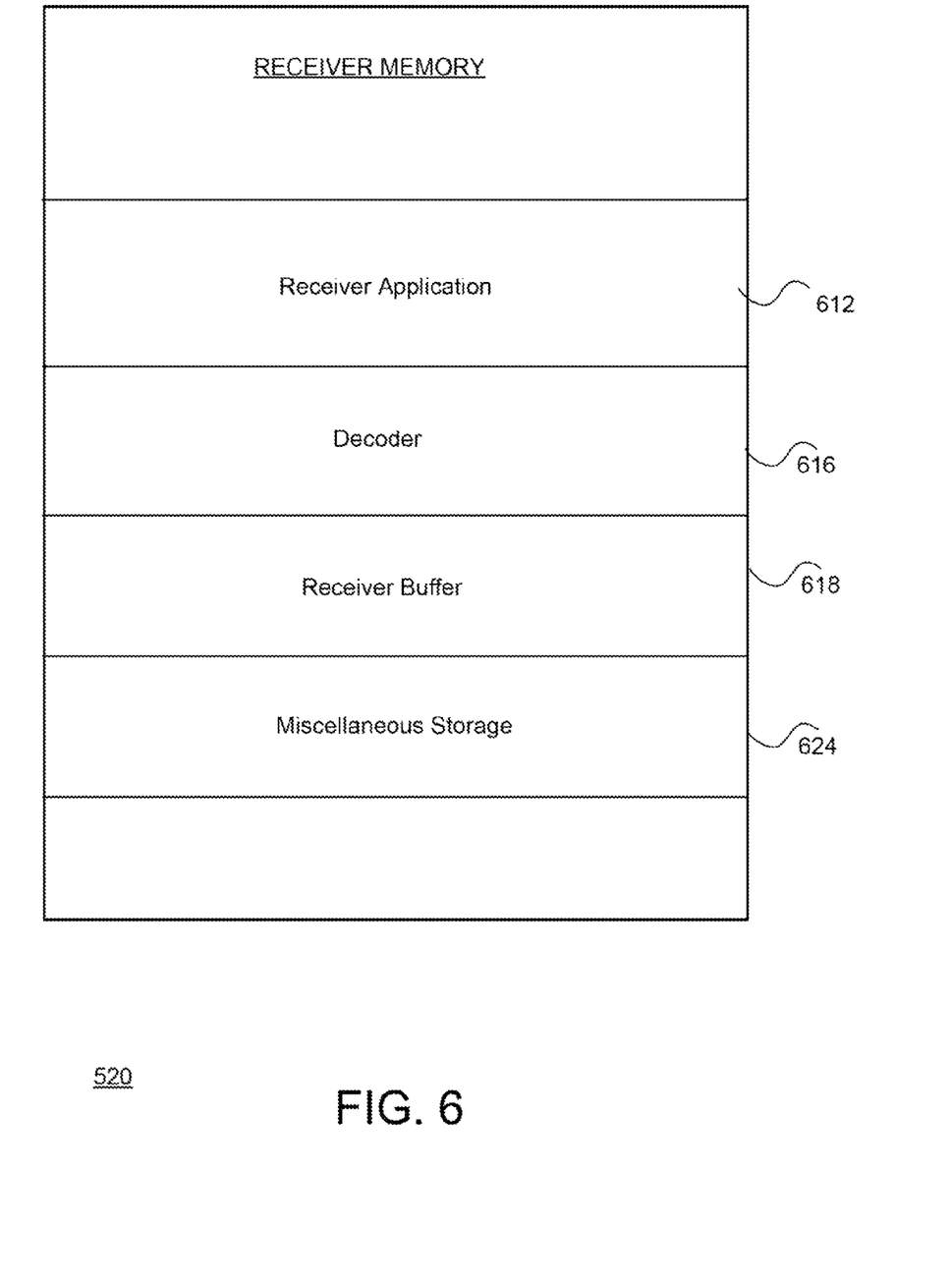
FIG. 6 is a block diagram for one embodiment of the receiver memory of FIG. 5, in accordance with the present invention.

Referring now to FIG. 6, a block diagram for one embodiment of the FIG. 5 receiver memory 520 is shown, in accordance with the present invention. In the FIG. 6 embodiment, receiver memory 520 includes, but is not limited to, a receiver application 612, a decoder 616, a receiver buffer 618, and miscellaneous storage 624. In alternate embodiments, receiver memory 520 may include various other components and functionalities in addition to, or instead of, certain of those components and functionalities discussed in conjunction with the FIG. 6 embodiment.

In the FIG. 6 embodiment, receiver application 612 may include program instructions that are preferably executed by transmit CPU 212 (FIG. 2) to perform various functions and operations for receiver 126. The particular nature and functionality of receiver application 612 typically varies depending upon factors such as the specific type and particular functionality of the corresponding receiver 126. In the FIG. 6 embodiment, receiver 126 may utilize a decoder 616 to analyze parity blocks 420 of received packets 410 (FIG. 4) for performing packet verification procedures by utilizing any effective techniques. In addition, decoder 616 may also utilize the parity blocks 420 to perform packet reconstruction procedures if any of the transmitted packets 410 are corrupted or otherwise invalid.

For example, in certain embodiments, a parity block 420 from a given packet 410 may be encoded by utilizing digital information from one or more surrounding packets to thereby permit verification and reconstruction if the given packet is corrupted during transmission. One specific technique for utilizing parity blocks 420 to verify and reconstruct packets 410 is discussed below in conjunction with FIGS. 7 and 9. In the FIG. 6 embodiment, decoder 616 may utilize receiver buffer 618 to temporarily store packets 410 during the foregoing verification and reconstruction procedures. Decoder 616 may thus looks slightly backward and forward in time to perform the verification and reconstruction procedures in real time. In the FIG. 6 embodiment, receiver 126 may utilize miscellaneous storage 624 for storing any required types of additional information.

In the FIG. 6 embodiment, decoder 616 is shown a being implemented as software program instructions. However, in certain embodiments, decoder 616 may be alternately implemented as hardware components that perform equivalent functions. Additional details regarding the operation and implementation of decoder 616 are further discussed below in conjunction with FIGS. 7 and 9.

Figure 7:
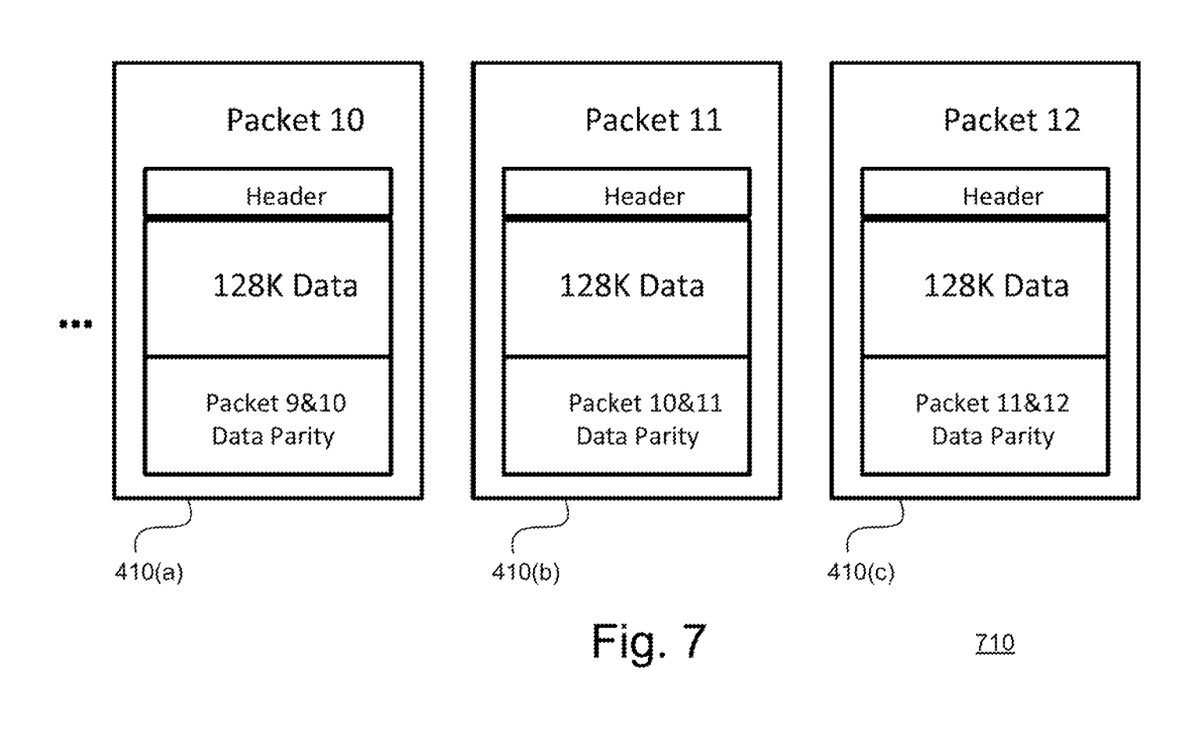
FIG. 7 is a block diagram illustrating a multi-packet parity technique, in accordance with one embodiment of the present invention.

Referring now to FIG. 7, a block diagram illustrating a multi-packet parity technique is shown, in accordance with one embodiment of the present invention. The FIG. 7 embodiment is presented for purposes of illustration, and in alternate embodiments, the present invention may utilize parity techniques that include components, functionalities, and information in addition to, or instead of, certain of those components, functionalities, and information discussed in conjunction with the FIG. 7 embodiment. For example, in the FIG. 7 embodiment, the multi-packet parity technique is illustrated with three consecutive packets 410. However, in alternate embodiments, any effective number of consecutive or non-consecutive packets 410 may be utilized.

In the FIG. 7 embodiment, a packet 10 (410(*a*)), a packet 11 (410(*b*)), and a packet 12 (410(*c*)) are shown. As shown above in FIG. 4, each packet 410 includes a header, data, and a parity block. In the FIG. 7 example, the data size is shown as being equal to 128K (eight bits of binary data). In the FIG. 7 embodiment, the respective parity blocks are encoded and embedded by encoder 316 (FIG. 3) based upon the binary eight-bit data values of a current packet and an immediately preceding packet. For example, the parity block for packet 11 (410(*b*)) is formed from the data values of preceding packet 10 (410(*a*)) and current packet 11 (410(*b*)).

In certain embodiments, encoder 316 may thus perform a parity encoding procedure for each packet 410 by temporarily storing required input packets 410 in a transmit buffer 320. Encoder 316 may then perform an exclusive OR operation on each pair of corresponding bit positions from the data segments of a current packet and an immediately preceding packet. For example, let us assume that data from packet 11 (D11) equals binary 00110110, and that data from packet 12 (D12) equals binary 11001010. In the FIG. 7 embodiment, to encode a parity block for packet 12 (410(*c*)), encoder 316 may perform an exclusive OR operation on corresponding bits of D11 and D12 to obtain a parity block (P12) for packet 12 that is equal to binary 11111100.

In accordance with the present invention, a decoder 616 (FIG. 6) may then perform a packet validation procedure to determine whether a given packet 410 is corrupted. In the FIG. 7 embodiment, decoder 616 may perform an exclusive OR operation on each pair of corresponding bit positions from the data segments of a current packet and an immediately preceding packet. As in the foregoing example, let us assume that data from packet 11 (D11) equals binary 00110110, and that data from packet 12 (D12) equals binary 11001010. In the FIG. 7 embodiment, to validate packet 12 (410(*c*), encoder 316 may perform an exclusive OR operation on corresponding bits of D11 and D12 to obtain a check value (equal to binary 11111100) to compare with parity block (P12) for packet 12. If the check value matches the parity block P12, then packet 12 is intact, and is not corrupted.

However, in the FIG. 7 embodiment, if the check value does not match the parity block, then decoder 616 may perform a packet reconstruction procedure for a current packet 410 based upon the binary data value and the binary parity block for an immediately succeeding packet 410. For example, let us assume that packet 11 (410(*b*)) is damaged or missing. As in the foregoing example, let us also assume that the parity block from packet 12 (P12) equals binary 11111100, and that data from packet 12 (D12) equals binary 11001010. In order to reconstruct the corrupted binary data from packet 11, decoder 616 may perform an exclusive OR operation on corresponding bits of P12 and D12 to reconstruct the damaged binary data (equal to binary 00110110) from packet 11 (410(*b*)). The present invention thus utilizes a multi-packet parity technique to validate and potentially reconstruct corrupted packets 410.

Figure 8A:
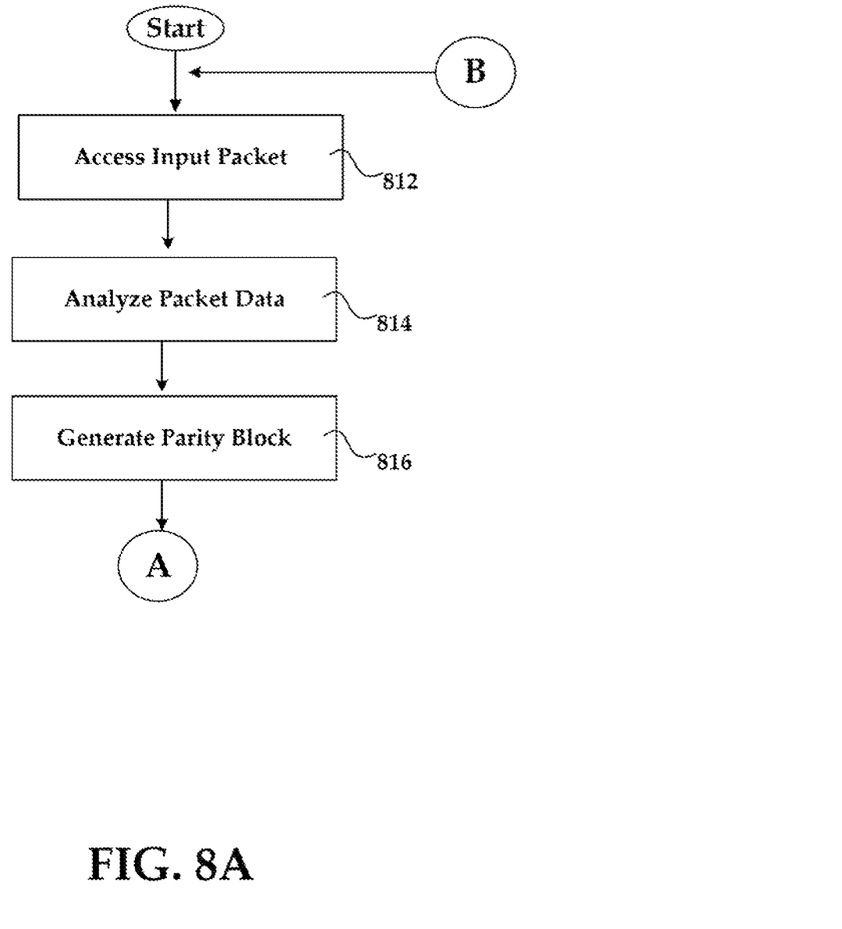
FIGS. 8A-8B are a flowchart of method steps for performing a packet encoding procedure, in accordance with one embodiment of the present invention.
Figure 8B:
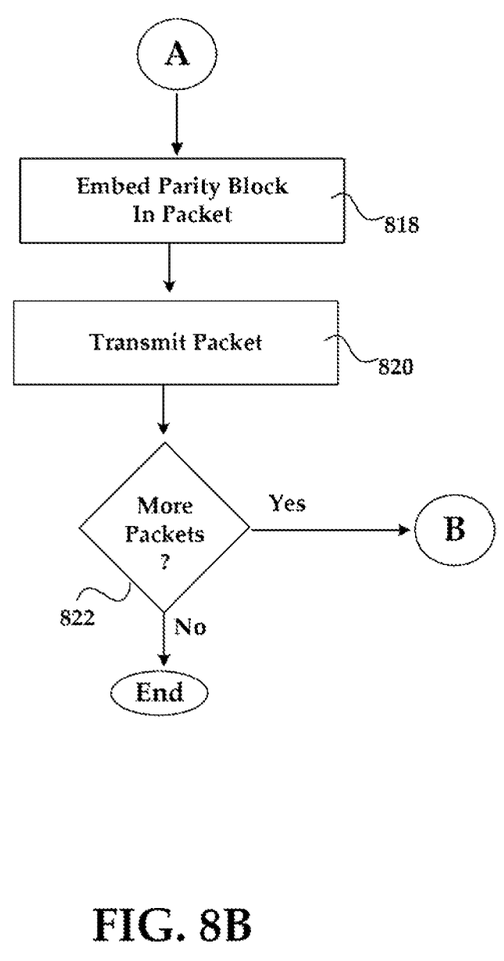

Referring now to FIGS. 8A-8B, a flowchart of method steps for performing a packet encoding procedure is shown, in accordance with one embodiment of the present invention. The flowchart of FIGS. 8A-8B is presented for purposes of illustration, and in alternate embodiments, the present invention may utilize steps and sequences other than those steps and sequences discussed in conjunction with the embodiment of FIGS. 8A-8B.

In the FIG. 8 embodiment, in step 812, an encoder 316 of a transmitter 118 initially accesses an input packet 410 from any appropriate source device. In step 814, the encoder 316 analyzes data 416 from the input packet 410. In step 816, the encoder 316 generates a parity block 420 for the input packet 410 by utilizing any appropriate techniques. For example, in certain embodiments, the encoder 316 generates the parity block 420 based upon binary data values of the input packet 410 in combination with the binary data values of one or more neighboring packets 410.

In step 818, the encoder 316 embeds the parity block 420 in the input packet 410. In step 820, the transmitter 118 may then transmit the encoded packet 410 to a receiver 126 by utilizing any appropriate means. In step 822, the encoder 316 determines whether any more packets 410 remain to be encoded. If additional packets 410 remain, then the FIG. 8 process returns to foregoing step 812 to encode and transmit the remaining packets 410. If no additional packets 410 remain, then the FIG. 8 process may terminate.

Figure 9A:
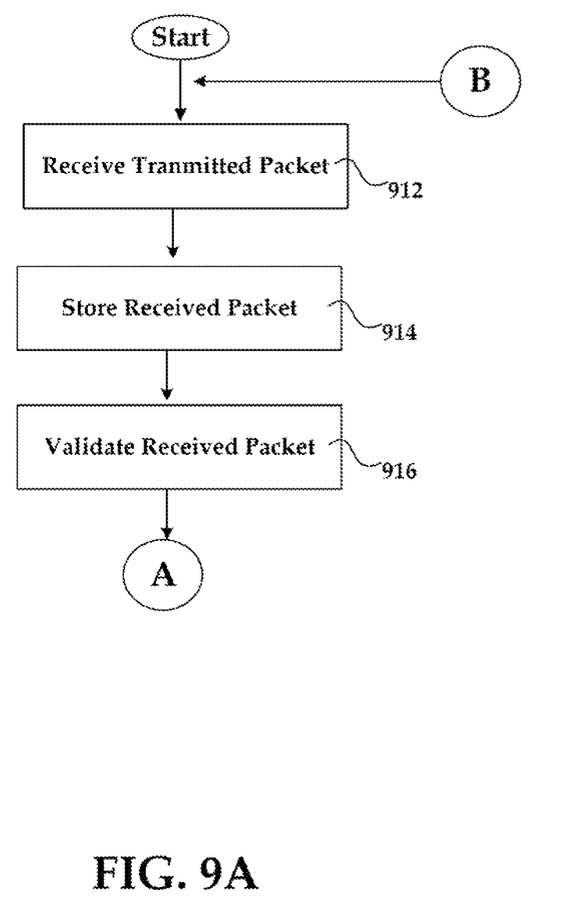
FIGS. 9A-9B are a flowchart of method steps for performing a packet reconstruction procedure, in accordance with one embodiment of the present invention
Figure 9B:
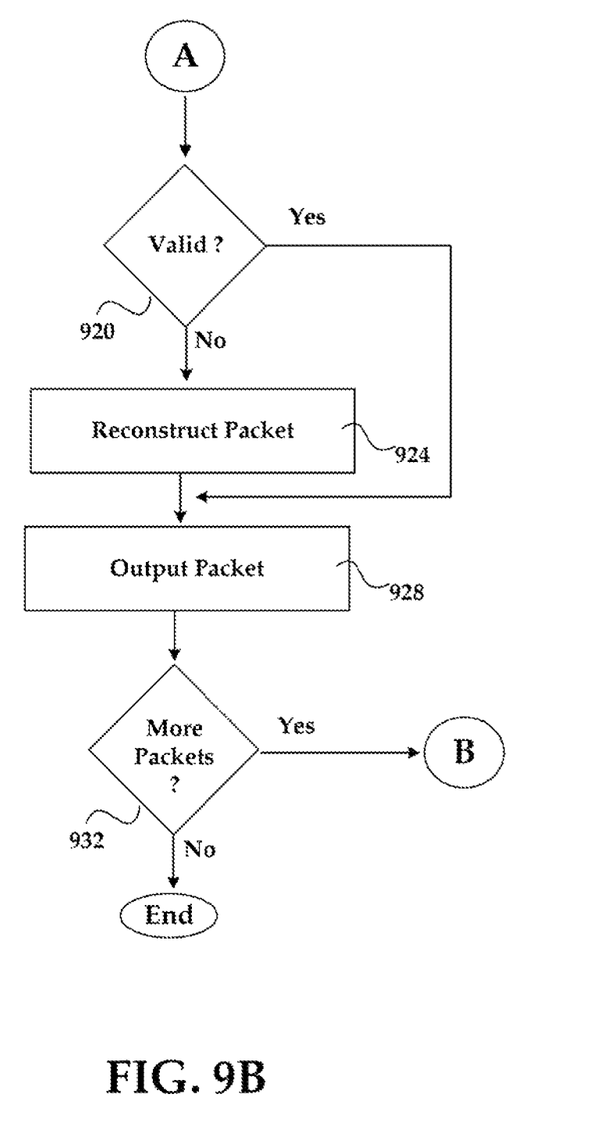

Referring now to FIGS. 9A-9B, a flowchart of method steps for performing a packet reconstruction procedure is shown, in accordance with one embodiment of the present invention. The flowchart of FIGS. 9A-9B is presented for purposes of illustration, and in alternate embodiments, the present invention may utilize steps and sequences other than those steps and sequences discussed in conjunction with the embodiment of FIGS. 9A-9B.

In the FIG. 9 embodiment, in step 912, a receiver 126 may receive a transmitted packet 410 by utilizing any appropriate techniques. In step 914, the receiver 126 stores the received packet 410 in a receiver buffer 618. In step 916, a decoder 616 performs a packet validation procedure upon the received packet 410 by utilizing any effective techniques. For example, in certain embodiments, the decoder 616 may validate the packet 410 by utilizing an embedded parity block 420.

In step 920, if the current packet 410 is valid (uncorrupted), then the receiver 126 may output the validated packet 410 to any appropriate destination device in step 928. However, if the current packet 410 is not valid (corrupted), then the decoder 616 may perform a packet reconstruction procedure by utilizing any appropriate techniques, as shown in step 924. For example, in certain embodiments, the decoder 616 may reconstruct a damaged packet 410 by utilizing data and parity block information from one or more neighboring packets 410.

Once the corrupted packet 410 is reconstructed, then receiver 126 may output the reconstructed packet 410 to any appropriate destination device in step 928. In step 932, the decoder 616 determines whether additional packets 410 remain to be validated and potentially reconstructed. If more packets 410 remain, then the FIG. 9 process returns to foregoing step 912 to validate, reconstruct, and output any additional packets 410. However, if no additional packets 410 remain, then the FIG. 9 process may terminate. For at least the foregoing reasons, the present invention therefore provides an improved system and method for effectively transferring electronic information.

The invention has been explained above with reference to certain embodiments. Other embodiments will be apparent to those skilled in the art in light of this disclosure. For example, the present invention may readily be implemented using certain configurations and techniques other than those described in the specific embodiments above. Additionally, the present invention may effectively be used in conjunction with systems other than those described above. Therefore, these and other variations upon the discussed embodiments are intended to be covered by the present invention, which is limited only by the appended claims.

What is claimed is:

1. A system for transferring electronic information, comprising:
   a transmitter that includes an encoder that performs a parity encoding procedure to create parity blocks based upon data segments from one or more transmission packets, said encoder embedding a different one of said parity blocks in each of said transmission packets; and a receiver that includes a decoder that utilizes said parity blocks for performing a packet validation procedure to identify corrupted packets from among said transmission packets, said decoder performing a packet reconstruction procedure with selected ones of said data segments and said parity blocks to produce reconstructed data segments for said corrupted packets, said decoder performing said packet reconstruction procedure by utilizing a multi-packet technique that utilizes information from one or more adjacent ones of said transmission packets.

2. The system of claim 1 wherein said transmission packets each include a packet header, one of said data segments, and one of said parity blocks.

3. The system of claim 1 wherein said transmitter and said receiver are in a data transmission network in which said transmitter communicates with said receiver over a unidirectional communication link from said transmitter to said receiver, said parity blocks enabling said receiver to reconstruct said corrupted packets without communicating back to said transmitter.

4. The system of claim 3 wherein said data transmission network is implemented as a wireless television broadcast network.

5. The system of claim 1 wherein said corrupted packets have said data segments that are damaged or missing.

6. The system of claim 1 wherein said encoder performs said parity encoding procedure by utilizing a transmit buffer to store a plurality of said transmission packets for accessing said data segments.

7. The system of claim 1 wherein said encoder performs said parity encoding procedure with said data segments from a current packet and an immediately preceding packet.

8. The system of claim 7 wherein said encoder performs said parity encoding procedure by applying an exclusive OR operation to corresponding bits of said data segments from said current packet and said immediately preceding packet to produce a corresponding one of said parity blocks.

9. The system of claim 1 wherein said decoder performs said packet validation procedure by recalculating a current parity block with said data segments from a current packet and an immediately preceding packet.

10. The system of claim 9 wherein said decoder performs said packet validation procedure by applying an exclusive OR operation to corresponding bits of said data segments from said current packet and said immediately preceding packet to recalculate said corresponding one of said parity blocks.

11. The system of claim 1 wherein said decoder performs said packet reconstruction procedure by recalculating a current data segment by utilizing a succeeding data segment and a corresponding succeeding parity block from an immediately succeeding transmission packet.

12. The system of claim 11 wherein said decoder performs said packet reconstruction procedure by applying an exclusive OR operation to corresponding bits of said succeeding data segment and said corresponding succeeding parity block from said immediately succeeding transmission packet.

13. The system of claim 1 wherein said decoder performs said packet validation procedure and said packet reconstruction procedure by utilizing a receiver buffer to store a plurality of said transmission packets for accessing said data segments and said parity blocks.

14. The system of claim 1 wherein said transmitter accesses said transmission packets from a source device, said encoder analyzing said data segments from said transmission packets, said encoder responsively generating said parity blocks based upon said data segments.

15. The system of claim 14 wherein said encoder embeds said parity blocks in corresponding ones of said transmission packets, said transmitter then modulating and sending said transmission packets to said receiver.

16. The system of claim 15 wherein said receiver receives and demodulates said transmission packets, said receiver storing said transmission packets in a receiver buffer for accessing said data segments and said parity blocks.

17. The system of claim 16 wherein said decoder validates said transmission packets to identify said corrupted packets, said encoder reconstructing said corrupted packets with said parity blocks, said receiver then outputting said transmission packets to a destination device.

18. A method for transferring electronic information, comprising:

utilizing an encoder of a transmitter to perform a parity encoding procedure to create parity blocks based upon data segments from one or more transmission packets, a different one of said parity blocks being embedded in each of said transmission packets; and providing a decoder of a receiver for using said parity blocks to perform a packet validation procedure to identify corrupted packets from among said transmission packets, said decoder performing a packet reconstruction procedure with selected ones of said data segments and said parity blocks to produce reconstructed data segments for said corrupted packets, said decoder performing said packet reconstruction procedure by utilizing a multi-packet technique that utilizes information from one or more adjacent ones of said transmission packets.

* * * * *